US012787278B2

(12) United States Patent
Takekida et al.

(10) Patent No.: US 12,787,278 B2
(45) Date of Patent: Nov. 3, 2026

(54) SEMICONDUCTOR STORAGE DEVICE

(71) Applicant: Kioxia Corporation, Tokyo (JP)

(72) Inventors: Hideto Takekida, Nagoya Aichi (JP); Yosuke Murakami, Mie Mie (JP); Keisuke Nakatsuka, Kobe Hyogo (JP); Yefei Han, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 330 days.

(21) Appl. No.: 18/671,074

(22) Filed: May 22, 2024

(65) Prior Publication Data

US 2024/0315019 A1 Sep. 19, 2024

Related U.S. Application Data

(63) Continuation of application No. PCT/JP2021/046434, filed on Dec. 16, 2021.

(51) Int. Cl.
*H10B 43/10* (2023.01)
*H10B 43/20* (2023.01)
*H10B 43/50* (2023.01)

(52) U.S. Cl.
CPC ............. *H10B 43/10* (2023.02); *H10B 43/20* (2023.02); *H10B 43/50* (2023.02)

(58) Field of Classification Search
CPC ......... H10B 43/50; H10B 43/20; H10B 43/10
See application file for complete search history.

(56) References Cited

U.S. PATENT DOCUMENTS 10,741,582 B2 8/2020 Herner et al.
11,018,153 B2 * 5/2021 Kai ........................ H10B 43/10
12,069,855 B2 * 8/2024 Fukuzumi .......... G11C 16/0466
2020/0168630 A1 5/2020 Borukhov
2020/0219572 A1 7/2020 Harari
2020/0258581 A1 8/2020 Cernea
2020/0303414 A1 9/2020 Harari et al.
(Continued)

FOREIGN PATENT DOCUMENTS

CN 113272958 A 8/2021
JP 2010251572 A 11/2010
(Continued)

OTHER PUBLICATIONS

U.S. Appl. No. 18/632,304, First Named Inventor: Hideto Takekida; Title: "Memory Device"; filed Apr. 11, 2024.

*Primary Examiner* — Steven M Page
(74) *Attorney, Agent, or Firm* — Holtz, Holtz & Volek PC

(57) ABSTRACT

A semiconductor storage device of an embodiment includes a first conductive layer, a second conductive layer, a first conductive pillar, a first semiconductor layer, and a first storage layer. The first conductive layer extends in a first direction. The second conductive layer is along the first conductive layer in a third direction intersecting the first direction. The second conductive layer extends in the first direction. The first conductive pillar penetrates the first conductive layer and the second conductive layer in the third direction. The first semiconductor layer is in contact with the first conductive layer and the second conductive layer. The first semiconductor layer faces the first conductive pillar in the first direction. The first storage layer is between the first semiconductor layer and the first conductive pillar.

5 Claims, 15 Drawing Sheets

(56) References Cited

U.S. PATENT DOCUMENTS

| | | | | |
|---|---|---|---|---|
| 2020/0328228 | A1 | 10/2020 | Harari et al. | |
| 2020/0343252 | A1 | 10/2020 | Lai et al. | |
| 2021/0020655 | A1* | 1/2021 | Yoshimura | H10B 43/35 |
| 2021/0050359 | A1* | 2/2021 | Kai | H10B 43/10 |
| 2021/0288065 | A1* | 9/2021 | Imamura | H10B 43/27 |
| 2023/0320107 | A1 | 10/2023 | Nakatsuka et al. | |

FOREIGN PATENT DOCUMENTS

| | | | |
|---|---|---|---|
| JP | 2019526934 | A | 9/2019 |
| WO | 2018039654 | A1 | 3/2018 |
| WO | 2021029916 | A1 | 2/2021 |

* cited by examiner

SEMICONDUCTOR STORAGE DEVICE

CROSS-REFERENCE TO RELATED APPLICATION

This application is a continuation of International Application No. PCT/JP2021/046434, filed Dec. 16, 2021, and the entire contents of which are incorporated herein by reference.

FIELD

Embodiments of the present invention relate to a semiconductor storage device.

BACKGROUND ART

A NAND type flash memory in which memory cells are stacked three-dimensionally is known.

DETAILED DESCRIPTION

Figure 1:
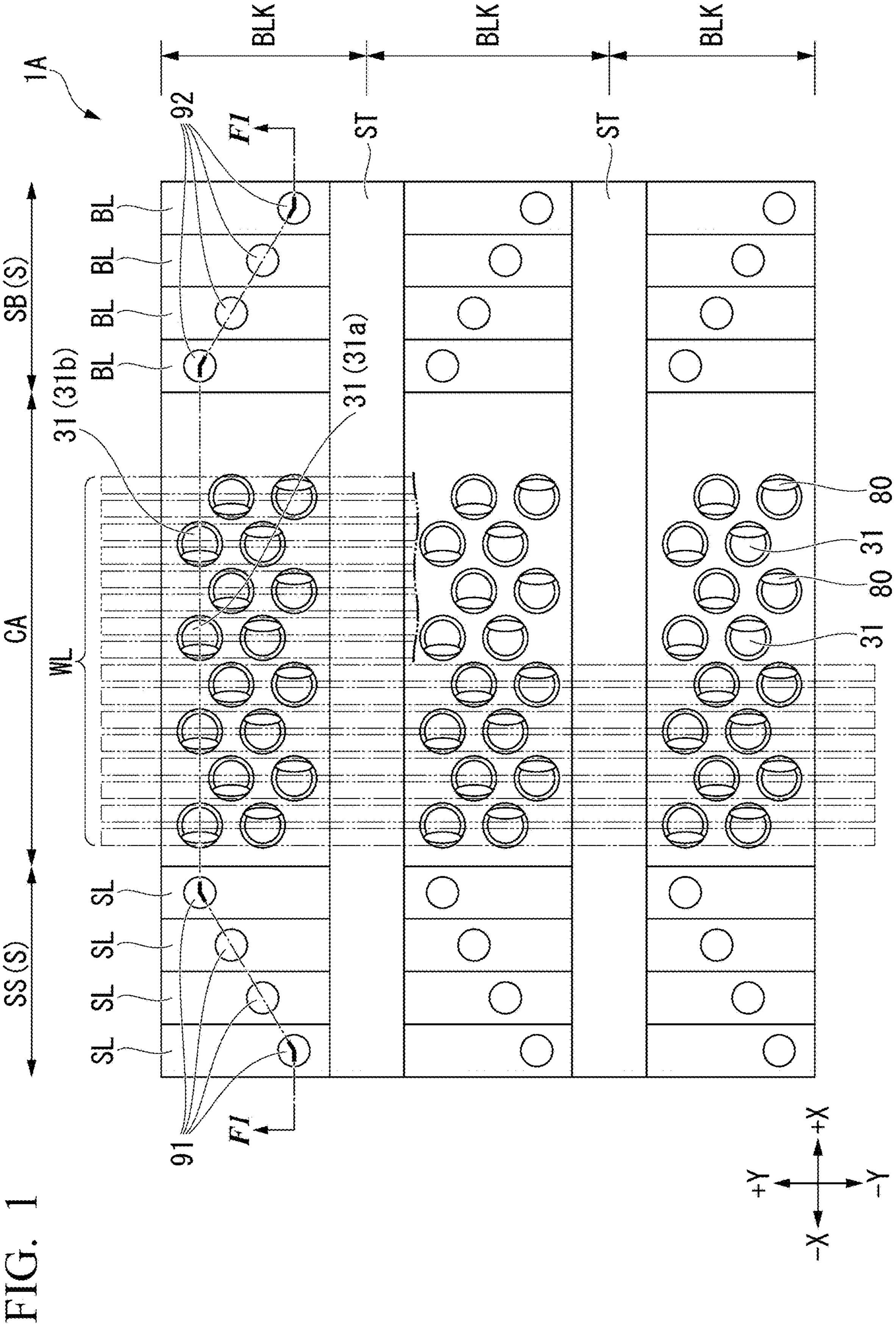
FIG. 1 is a plan view showing a semiconductor storage device of a first embodiment.

A semiconductor storage device of an embodiment includes a first conductive layer, a second conductive layer, a first conductive pillar, a first semiconductor layer, and a first storage layer. The first conductive layer extends in a first direction. The second conductive layer is along the first conductive layer in a third direction intersecting the first direction. The second conductive layer extends in the first direction. The first conductive pillar penetrates the first conductive layer and the second conductive layer in the third direction. The first semiconductor layer is in contact with the first conductive layer and the second conductive layer. The first semiconductor layer faces the first conductive pillar in the first direction. The first storage layer is between the first semiconductor layer and the first conductive pillar.

Hereinafter, a semiconductor storage device according to embodiments will be described with reference to the drawings. In the following description, components having the same or similar functions are denoted by the same reference signs. Also, duplicate description of the components may be omitted. The drawings are schematic or conceptual, and a relationship between a thickness and a width of each portion, a size ratio between portions, or the like are not necessarily the same as actual ones. In the present application, “connection” is not limited to a case of being physically connected, and also includes a case of being electrically connected. In the present application, “parallel”, “orthogonal”, or “the same” includes a case of “substantially parallel”, “substantially orthogonal”, or “substantially the same”. In the present application, “extending in an A direction” means that, for example, a dimension in the A direction is larger than a minimum dimension of dimensions in an X direction, a Y direction, and a Z direction to be described below. The “A direction” described herein is a direction optionally selected from the X direction, the Y direction, and the Z direction.

First, a +X direction, a −X direction, a +Y direction, a −Y direction, a +Z direction, and a −Z direction will be defined. The +X direction, the −X direction, the +Y direction, and the −Y direction are directions along a surface 10*a* (refer to FIG. 2) of a silicon substrate 10 to be described later. The +X direction is one of directions orthogonal to a direction in which a word line wiring WL (refer to FIG. 1) to be described later extends. The −X direction is a direction opposite to the +X direction. In a case in which the +X direction and the −X direction do not need to be distinguished from each other, they will be simply referred to as the “X direction”. The +Y direction and the −Y direction are directions intersecting (for example, orthogonal to) the X direction. The +Y direction is one of directions in which the word line wiring WL (refer to FIG. 1) to be described later extends. The −Y direction is a direction opposite to the +Y direction. In a case in which the +Y direction and the −Y direction do not need to be distinguished from each other, they will be simply referred to as the “Y direction”. The +Z direction and the −Z direction are directions intersecting (for example, orthogonal to) the X direction and the Y direction, and are a thickness direction of the silicon substrate 10 (refer to FIG. 2). The +Z direction is a direction toward a multilayered body 20 to be described later from the silicon substrate 10. The −Z direction is a direction opposite to the +Z direction. In a case in which the +Z direction and the −Z direction do not need to be distinguished from each other, they will be simply referred to as the “Z direction”. In the present specification, the “+Z direction” may be referred to using “upward”, and the “−Z direction” may be referred to using “downward”. However, these expressions are for convenience only and do not define the direction of gravity. The +X direction is an example of a “first direction”. The +Y direction is an example of a “second direction”. The +Z direction is an example of a “third direction”.

In some of plan views shown in the drawings referred to below, hatching is appropriately added to some components in order to make the drawings easier to see. Hatching added to the plan views is not necessarily related to a material or characteristics of the component to which the hatching is added. In each of a plan view and a cross-sectional view, illustration of some components such as wirings, contacts, and interlayer insulating films may be omitted as appropriate for easy viewing of the drawings.

First Embodiment

<1. Configuration of Semiconductor Storage Device>

First, a configuration of a semiconductor storage device 1A of a first embodiment will be described. The semiconductor storage device 1A is, for example, a nonvolatile semiconductor storage device.

Figure 2:
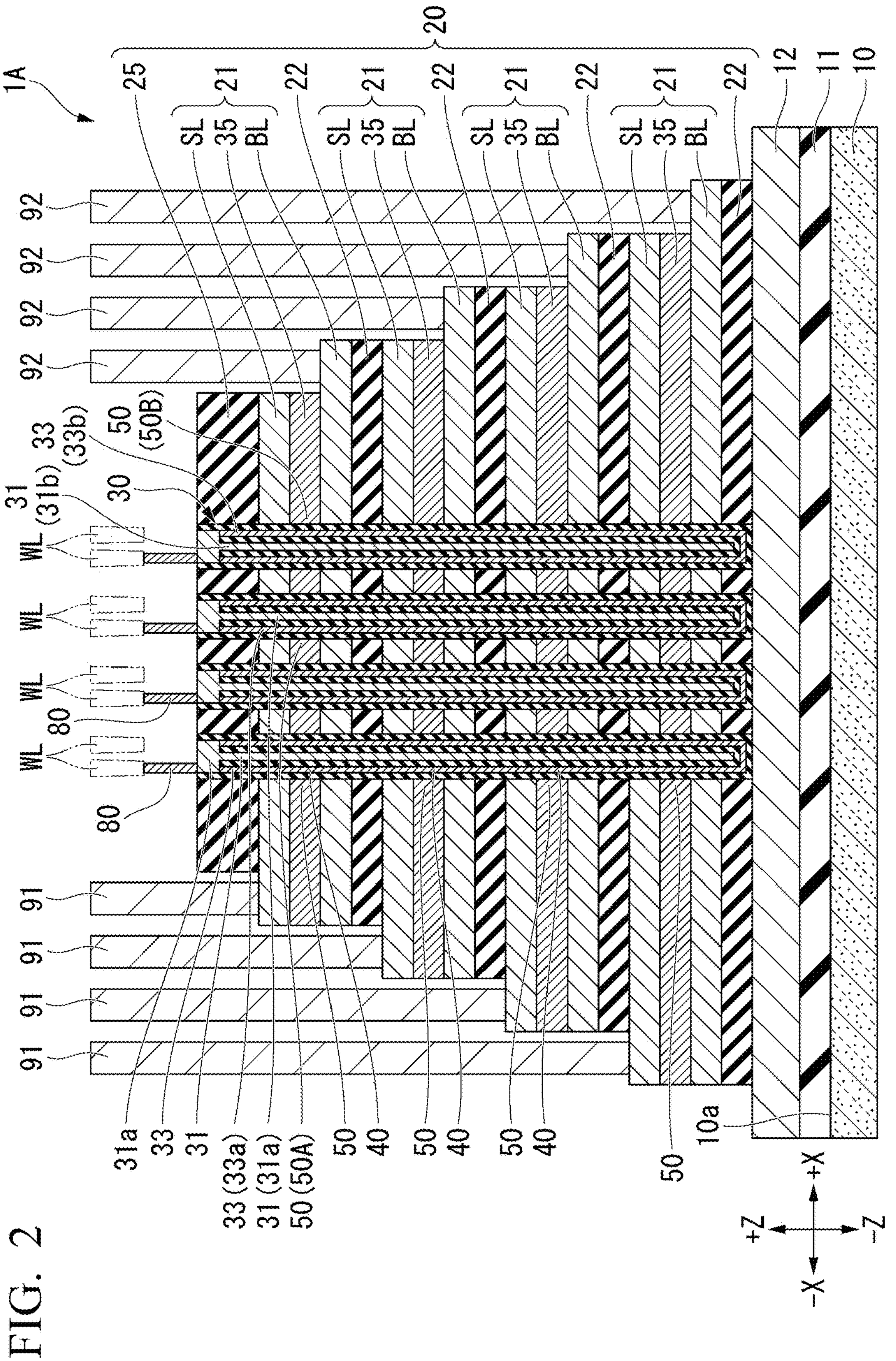
FIG. 2 is a cross-sectional view showing the semiconductor storage device of the first embodiment.

FIG. 1 is a plan view showing a part of the semiconductor storage device 1A of the first embodiment. FIG. 2 is a cross-sectional view showing the semiconductor storage device 1A. FIG. 2 is a cross-sectional view showing the semiconductor storage device 1A taken along line F1-F1 shown in FIG. 1. Further, for convenience of explanation, some word line wirings WL among a plurality of word line wirings WL shown in FIG. 1 are omitted in FIG. 2.

As shown in FIG. 1, the semiconductor storage device 1A includes a cell array region CA and staircase regions S provided at both ends of the cell array region CA in an X-axis direction. The semiconductor storage device 1A is divided into a plurality of blocks BLK by slits ST. That is, a region divided by the slits ST corresponds to one block BLK. The staircase regions S are divided into a source line lead-out region SS and a bit line lead-out region SB. A lead-out line 91 extending in the Z direction is provided in the source line lead-out region SS. The lead-out line 91 connects a source line SL and a source line wiring (not shown in the drawings). A lead-out line 92 extending in the Z direction is provided in the bit line lead-out region SB. The lead-out line 92 connects a bit line BL and a bit line wiring (not shown in the drawings). Further, the source line lead-out region SS and the bit line lead-out region SB may be disposed in the same region. That is, the staircase region S may be provided only at one end part of the cell array region CA in the X-axis direction, and both the lead-out line 91 and the lead-out line 92 may be disposed together in the staircase region S.

As shown in FIG. 1, the cell array region CA includes a plurality of gate wirings 31 (for example, including gate wirings 31*a* and gate wirings 31*b*). The plurality of gate wirings 31 are provided, for example, in a lattice shape when viewed from the Z direction. In this way, in the semiconductor storage device 1A of the embodiment, memory cells provided in the gate wirings 31 adjacent in the X direction or the Y direction can also be integrated in the X direction or the Y direction. The gate wiring 31*a* is an example of a "first conductive pillar", and the gate wiring 31*b* is an example of a "second conductive pillar".

As shown in FIGS. 1 and 2, the semiconductor storage device 1A includes, for example, the silicon substrate 10, an insulating layer 11, a stopper layer 12, the multi-layered body 20, an insulating portion 25, a plurality of pillars (pillar-shaped bodies) 30, a plurality of contacts 80, and the plurality of word line wirings WL.

<1.1 Lower Structure of Semiconductor Storage Device>

The silicon substrate 10 is a substrate serving as a base of the semiconductor storage device 1A. At least a part of the silicon substrate 10 has a plate shape extending in the X direction and the Y direction. The silicon substrate 10 has the surface 10*a* facing the multi-layered body 20. The silicon substrate 10 is formed of a semiconductor material containing silicon (Si).

The insulating layer 11 is provided on the surface 10*a* of the silicon substrate 10. The insulating layer 11 has a layer shape extending in the X direction and the Y direction. The insulating layer 11 is formed of an insulating material such as silicon oxide ($SiO_2$). Some of peripheral circuits for operating the semiconductor storage device 1A may be provided between the silicon substrate 10 and the insulating layer 11.

The stopper layer 12 is provided on the insulating layer 11. The stopper layer 12 is a layer extending in the X direction and the Y direction. The stopper layer 12 has a stopper function of preventing a memory hole MH (refer to FIG. 7) from being deeply etched in a manufacturing process of the semiconductor storage device 1A to be described later. Although not particularly limited, the stopper layer 12 is formed of a semiconductor material such as polysilicon (Poly-Si), a metal material, an insulating material, or the like. If a depth of the memory hole MH is controlled by another element, the semiconductor layer 12 may be omitted.

<1.2 Multi-Layered Body>

Next, the multi-layered body 20 will be described.

The multi-layered body 20 is provided on the semiconductor layer 12. The multi-layered body 20 includes a plurality of functional layers 21 and a plurality of insulating layers 22. The plurality of functional layers 21 and the plurality of insulating layers 22 are alternately stacked in the Z direction. Although four functional layers 21 and four insulating layers 22 are shown in FIG. 1 for convenience of explanation, in practice, a larger number of the functional layers 21 and insulating layers 22 may be stacked.

The plurality of functional layers 21 each include the source line SL, the bit line BL, and a semiconductor layer 35. The semiconductor layer 35 is positioned between the source line SL and the bit line BL in the Z direction. The source line SL is an example of a "first conductive layer". The bit line BL is an example of a "second conductive layer". The semiconductor layer 35 is an example of a "first semiconductor layer". Further, as will be described in detail later, the semiconductor layer 35 includes a channel portion 50. The channel portion 50 is a region positioned close to the pillar 30 in the semiconductor layer 35. The channel portion 50 is a region in which a channel is formed when a voltage is applied to the gate wiring. The channel portion 50 is an example of a "first channel portion".

A plurality of source lines SL are layers each extending in the X direction. The plurality of source lines SL may also be, for example, layers extending in the X direction and the Y direction. The plurality of source lines SL are stacked in the Z direction at intervals. A plurality of bit lines BL are layers each extending in the X direction. The plurality of bit lines BL may also be, for example, layers extending in the X direction and the Y direction. The plurality of bit lines BL are aligned with the plurality of source lines SL in the Z direction and are stacked in the Z direction at intervals. Each of the plurality of bit lines BL is positioned between two source lines SL in the Z direction. The source lines SL and the bit lines BL are alternately stacked in the Z direction. The plurality of source lines SL and the plurality of bit lines BL are conductive portions stacked in the Z direction in the multi-layered body 20, and are wirings extending in the X direction and the Y direction in the multi-layered body 20.

The plurality of source lines SL and the plurality of bit lines BL are formed of a conductive material such as, for example, tungsten (W) or polysilicon (Poly-Si) doped with impurities. The source line SL and the bit line BL may each have a multi-layer structure in which, for example, tungsten (W) and polysilicon (Poly-Si) doped with impurities are stacked. In this case, polysilicon (Poly-Si) doped with impurities is provided near the semiconductor layer 35. Also, the source line SL and the bit line BL may each have a structure in which dissimilar metals are stacked, and in that case, a multi-layer structure in which, for example, titanium (Ti) or titanium nitride (TiN) and tungsten (W) are stacked may be used. In the embodiment, the "bit line" means a wiring through which a current flows toward the channel portion 50 to be described later. The bit line BL may be connected to a sense amplifier circuit SA that is a part of the peripheral circuit of the semiconductor storage device 1A. On the other hand, in the embodiment, the "source line" means a wiring through which a current that has passed through the channel portion 50 to be described later flows. The source line SL is connected to a ground of the semiconductor storage device 1A. Further, definitions of the "bit line" and "source line" are not limited to the above-described examples. For example, definitions of the "bit line" and "source line" may be reversed from the above-described example.

The plurality of semiconductor layers 35 are layers each extending in the X direction and the Y direction and are stacked in the Z direction at intervals. The semiconductor layer 35 is formed of a semiconductor material such as amorphous silicon (a-Si) or polysilicon (Poly-Si). The semiconductor layer 35 may be doped with impurities. Impurities contained in the semiconductor layer 35 are, for example, any ones selected from the group consisting of carbon, phosphorus, boron, and germanium.

In the embodiment, the semiconductor layer 35 includes the channel portion 50. As described above, the channel portion 50 is a region of the semiconductor layer 35 positioned close to the pillar 30. In other words, the channel portion 50 is a region of the semiconductor layer 35 in contact with the source line SL and the bit line BL in the Z direction and in contact with the pillar 30 in the X direction. In the embodiment, the "channel portion" means a region in which a channel is formed when a voltage is applied to the gate wiring 31. In the embodiment, the channel portion 50 is a region in which a current (channel current) flows from the bit line BL toward the source line SL when a predetermined voltage is applied to the gate wiring 31.

The insulating layer 22 included in the multi-layered body 20 is provided between two functional layers 21 adjacent to each other in the Z direction. The insulating layer 22 has a layer shape extending in the X direction and the Y direction. The insulating layer 22 is formed of an insulating material such as silicon oxide ($SiO_2$). The insulating layer 22 electrically insulates the source line SL and the bit line BL aligned in the Z direction.

The insulating portion 25 is provided on the uppermost functional layer 21 in the multi-layered body 20. The insulating portion 25 is positioned at the same height as an upper end part of the pillar 30 to be described later. The insulating portion 25 is provided between the plurality of pillars 30 in the X direction and the Y direction.

<1.3 Pillar>

Next, the pillar 30 will be described.

Figure 3:
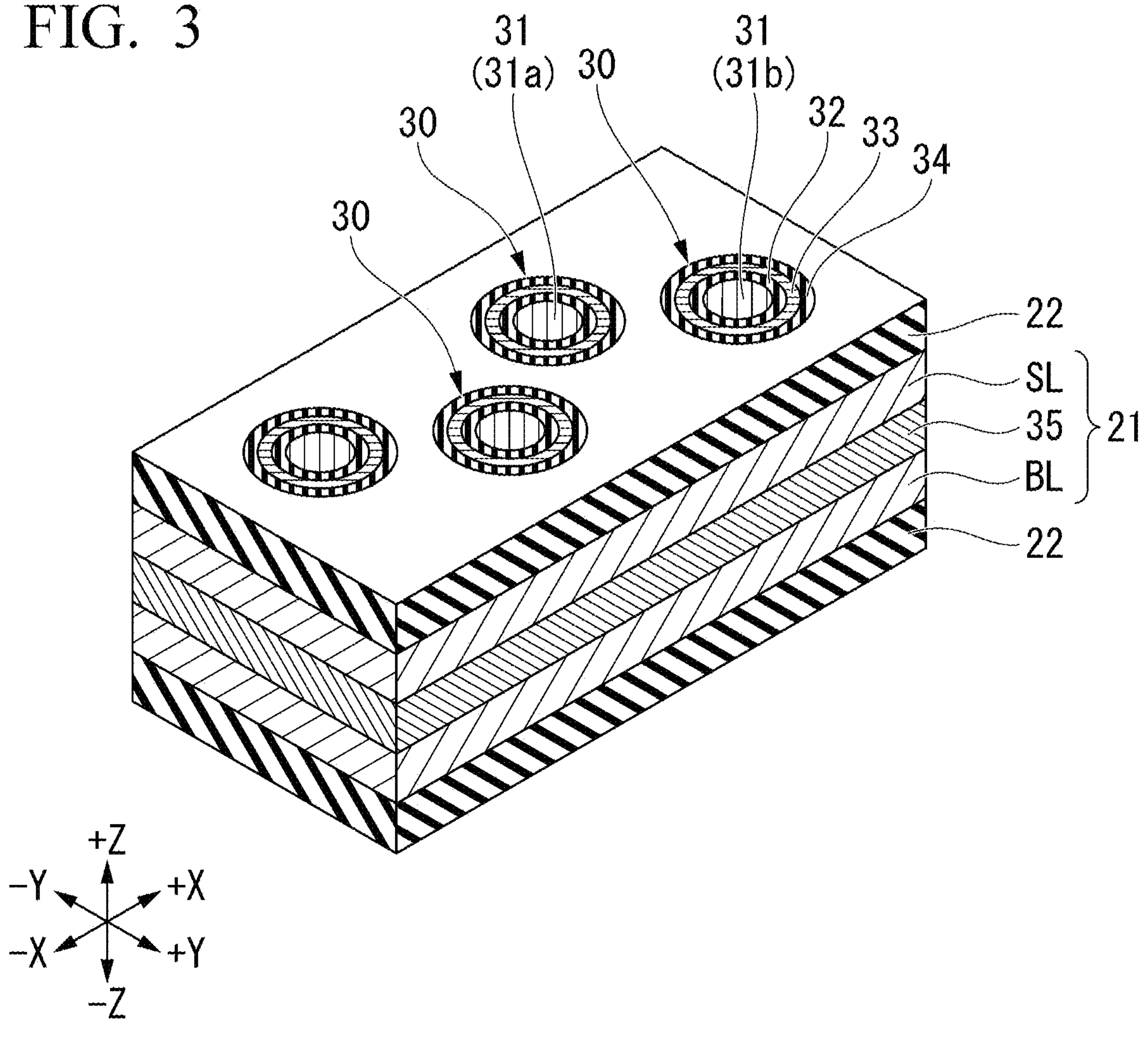
FIG. 3 is an overhead view showing a part of the semiconductor storage device of the first embodiment.

FIG. 3 is an overhead view showing a part of the semiconductor storage device of the first embodiment. In FIG. 3, only one functional layer 21 is shown for convenience of explanation.

As shown in FIG. 3, the plurality of pillars 30 are disposed in a matrix shape in the X direction and the Y direction. The pillars 30 each extend to penetrate the multi-layered body 20 and the insulating portion 25 in the Z direction (refer to FIG. 2). In FIG. 3, for convenience of explanation, an outer shape of each pillar 30 is shown as being cylindrical. However, the pillar 30 may have a rectangular parallelepiped shape, a conical shape, or the like.

In the embodiment, each pillar 30 has the gate wiring 31, a block insulating film 32, a memory film 33, and a tunnel insulating film 34.

The gate wiring 31 extends in the Z direction across the entire length (total height) of the pillar 30 in the Z direction. The gate wiring 31 forms a core (a central portion when viewed in the Z direction) of the pillar 30. The gate wiring 31 is a conductive portion penetrating the multi-layered body 20 and the insulating portion 25 in the Z direction. That is, an outer circumference of the gate wiring 31 is covered with the multi-layered body 20 including the semiconductor layer 35 (the channel portion 50) when viewed in the Z direction. The gate wiring 31 is formed of a conductive material such as tungsten (W) or polysilicon (Poly-Si) doped with impurities. In the embodiment, the "gate wiring" means a wiring to which a voltage is applied at the time of a data write operation or a data read operation. In other expression, the gate wiring 31 means a wiring to which a voltage is applied to change a state of charge of a charge holding portion 40 to be described later. The gate wiring 31 is connected to the word line wiring WL via the contact 80 to be described later. The gate wiring 31 is an example of the "first conductive pillar".

The block insulating film 32 is formed in an annular shape that surrounds the gate wiring 31 when viewed in the Z direction. The block insulating film 32 is provided between the gate wiring 31 and the memory film 33 to be described later. The block insulating film 32 is an insulating film that suppresses back tunneling. The back tunneling is a phenomenon in which charges return from the gate wiring 31 to the memory film 33 (the charge holding portion 40, see FIG. 2). The block insulating film 32 extends in the Z direction across most of the pillar 30 in the Z direction. The block insulating film 32 is a multi-layered structure film in which, for example, a silicon oxide film, a metal oxide film, and a plurality of insulating films are stacked. An example of the metal oxide is aluminum oxide ($Al_2O_3$). The block insulating film 32 may contain a high dielectric constant material (high-k material) such as silicon nitride (SiN) or hafnium oxide (HfO).

The memory film 33 (33*a*, 33*b*) is formed in an annular shape that surrounds the gate wiring 31 and the block insulating film 32 when viewed in the Z direction. In other words, the memory film 33 (33*a*, 33*b*) is formed in an annular shape that surrounds the gate wiring 31 when viewed in the Z direction. The memory film 33 is provided between the block insulating film 32 and the tunnel insulating film 34 to be described later. The memory film 33 extends in the Z direction in a cylindrical shape to cover most of the pillar 30. Further, the memory film 33 (33*a*, 33*b*) of the embodiment may be provided intermittently in the Z direction. That is, the memory film 33 (33*a*, 33*b*) need only be provided at least between the gate wiring 31 and the semiconductor layer 35.

The memory film 33 is a charge trap film capable of accumulating charges in crystal defects. The charge trap film is formed of, for example, silicon nitride ($Si_3N_4$). The memory film 33*a* is an example of a "first storage layer", and the memory film 33*b* is an example of a "second storage layer".

Here, in the semiconductor storage device 1A of the embodiment, as described above, memory cells provided in the gate wirings 31 adjacent in the X direction or the Y direction can be integrated also in the X direction or the Y direction. That is, the semiconductor storage device 1A of the embodiment includes, for example, the channel portion 50 (50A) facing the gate wiring 31*a* in the X direction, and the channel portion 50 (50B) facing the gate wiring 31*b* in the X direction. In such a case, the memory film 33*a* is provided between the channel portion 50A and the gate wiring 31*a*, and the memory film 33*b* is provided between the channel portion 50B and the gate wiring 31*b*. In this way, the semiconductor storage device 1A can integrate memory cells also in the X direction.

In the embodiment, the memory film 33 includes a plurality of charge holding portions 40 (refer to FIG. 2). Each of the charge holding portions 40 is a region positioned at the same height as the semiconductor layer 35 (the channel portion 50) in the memory film 33. The charge holding portion 40 is a storage portion capable of storing data by holding a state of charge (for example, an amount of charge or an orientation of polarization). The charge holding portion 40 changes a state of charge (for example, an amount of charge or an orientation of polarization) when a voltage satisfying a predetermined condition is applied to the gate wiring 31. Therefore, the charge holding portion 40 stores data in a non-volatile manner. For example, the charge holding portion 40 formed of the charge trap film stores data in a non-volatile manner according to an amount of charge.

The tunnel insulating film 34 is formed in an annular shape that surrounds the memory film 33 when viewed in the Z direction. In other words, the block insulating film 32 is provided between the memory film 33 and the functional layer 21. The tunnel insulating film 34 is a potential barrier between the charge holding portion 40 and the semiconductor layer 35 (the channel portion 50). The tunnel insulating film 34 extends in the Z direction across most of the pillar 30. The tunnel insulating film 34 is formed of an insulating material containing silicon oxide ($SiO_2$) or silicon oxide ($SiO_2$) and silicon nitride (SiN).

In the semiconductor storage device 1A shown in FIGS. 1 to 3, a metal-Al-nitride-oxide-silicon (MANOS) type memory cell is formed by the gate wiring 31, the block insulating film 32, the charge holding portion 40, the tunnel insulating film 34, and the channel portion 50 described above, but the cell structure of the embodiment is not limited to the MANOS type. That is, the cell structure of the embodiment may be a structure other than the MANOS type. In that case, the cell structure may be, for example, a ferroelectric gate field effect transistor (FeFET) having a ferroelectric film as the memory film 33. A ferroelectric film stores a data value according to, for example, an orientation of polarization. The ferroelectric film is formed of, for example, hafnium oxide (HfO), zirconia (ZrO), hafnium-zirconia oxide (HfZrO), or the like. The plurality of memory cells are three-dimensionally disposed at intervals in the X direction, Y direction, and Z direction.

Next, other structures of the multi-layered body 20 and the pillar 30 will be described.

As shown in FIG. 2, the gate wiring 31 has an enlarged-diameter portion 31*a* connected to the contact 80 at an upper end part of the pillar 30. The enlarged-diameter portion 31*a* protrudes in the X direction and the Y direction. The enlarged-diameter portion 31*a* is enlarged in size in the X direction and the Y direction compared to other portions of the gate wiring 31.

The contact 80 provided on an upper side of the pillar 30 is provided between the pillar 30 and the word line wiring WL in the Z direction. The contact 80 connects the gate wiring 31 of the pillar 30 and the word line wiring WL. The contact 80 is formed of a conductive material such as tungsten (W).

The plurality of word line wirings WL extend in the Y direction. As shown in FIG. 1, each of the word line wirings WL is commonly provided for the plurality of pillars 30. When a voltage is applied to the word line wiring WL, the voltage is applied to the corresponding contact 80.

A configuration of the semiconductor storage device 1A has been described above.

<2. Operation of Semiconductor Storage Device>

Next, an example of an operation of the semiconductor storage device 1A will be described.

Figure 4:
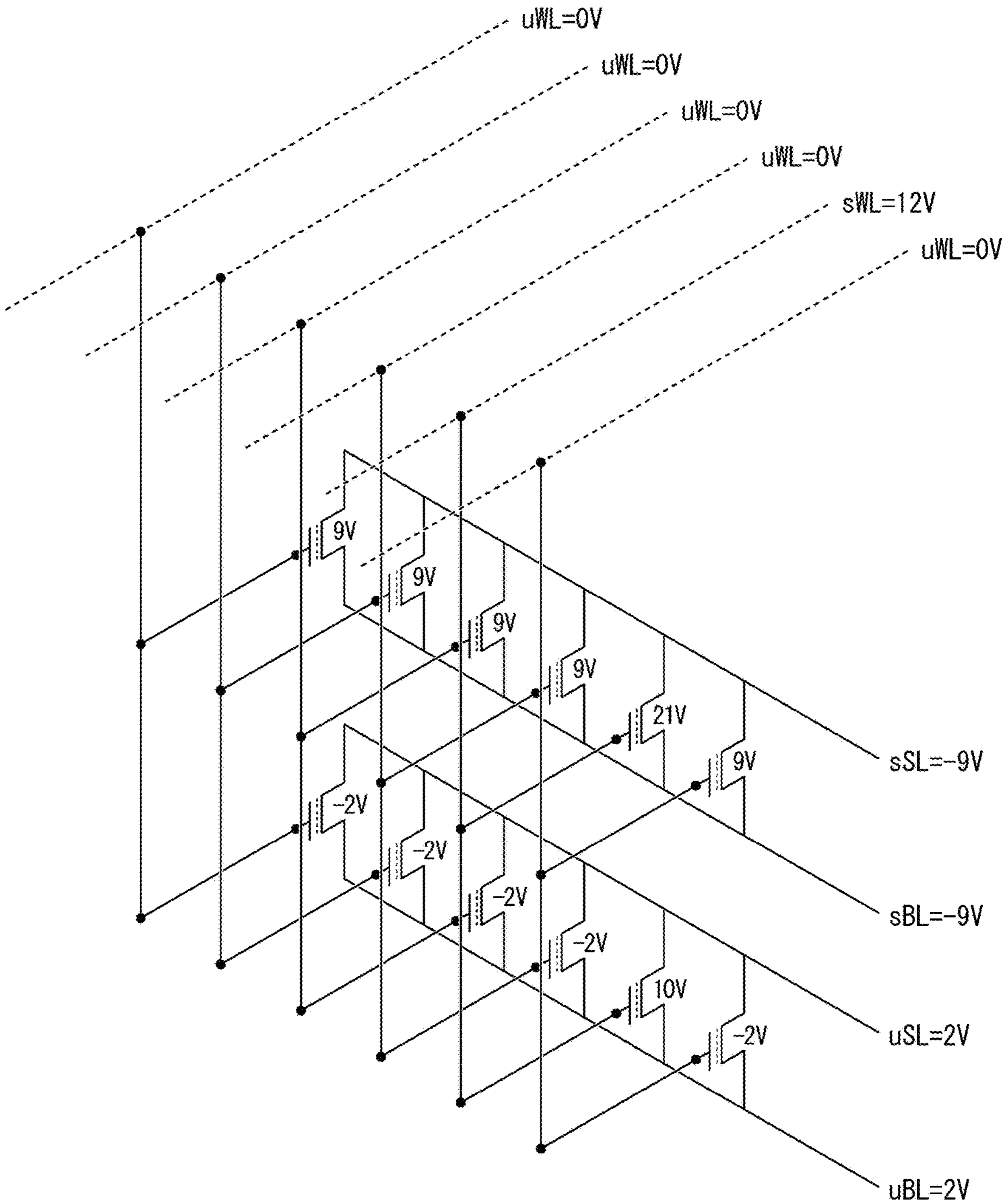
FIG. 4 is a diagram showing an equivalent circuit of the semiconductor storage device of the first embodiment.
Figure 5A:
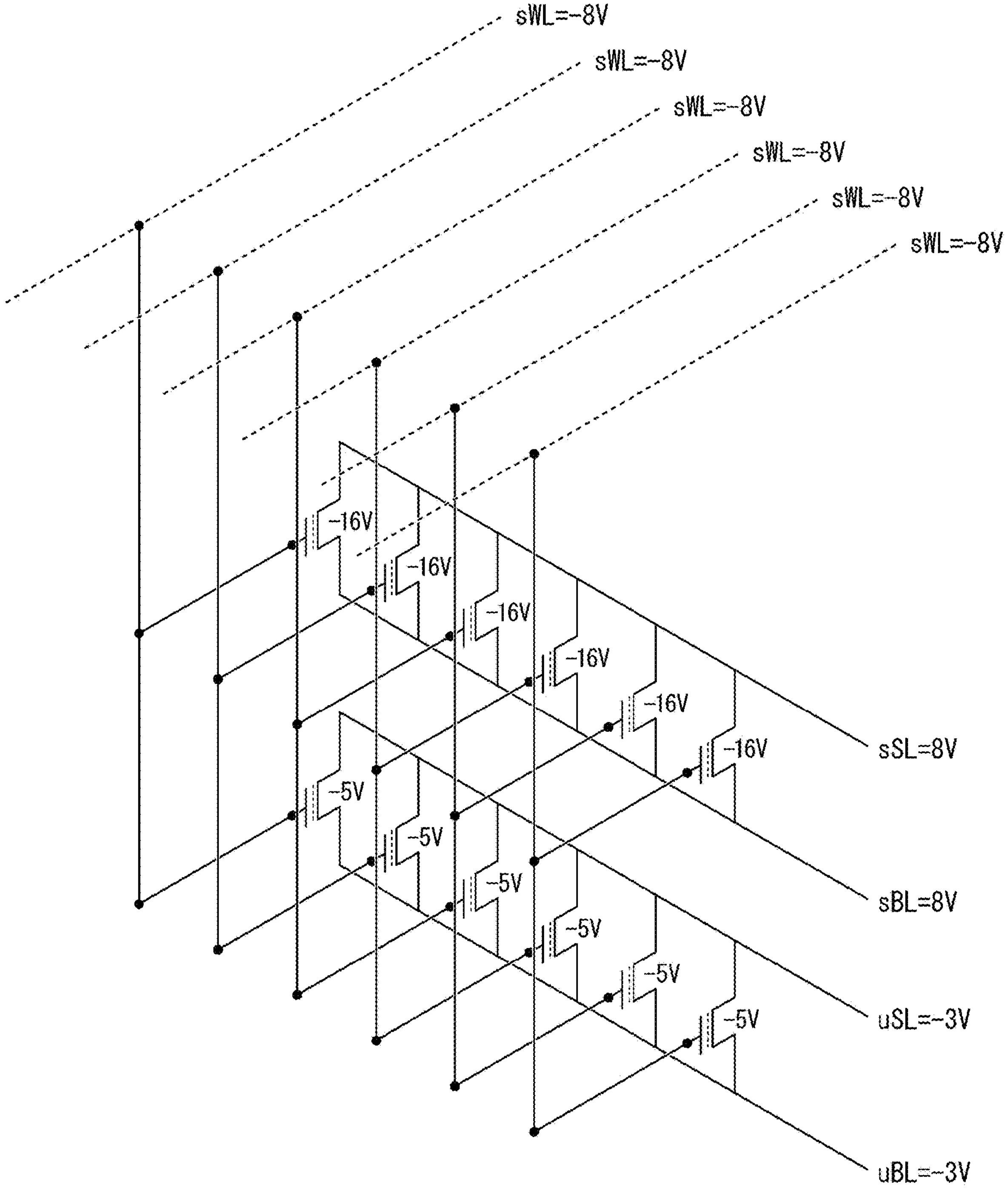
FIG. 5A is a diagram showing an equivalent circuit of the semiconductor storage device of the first embodiment.
Figure 5B:
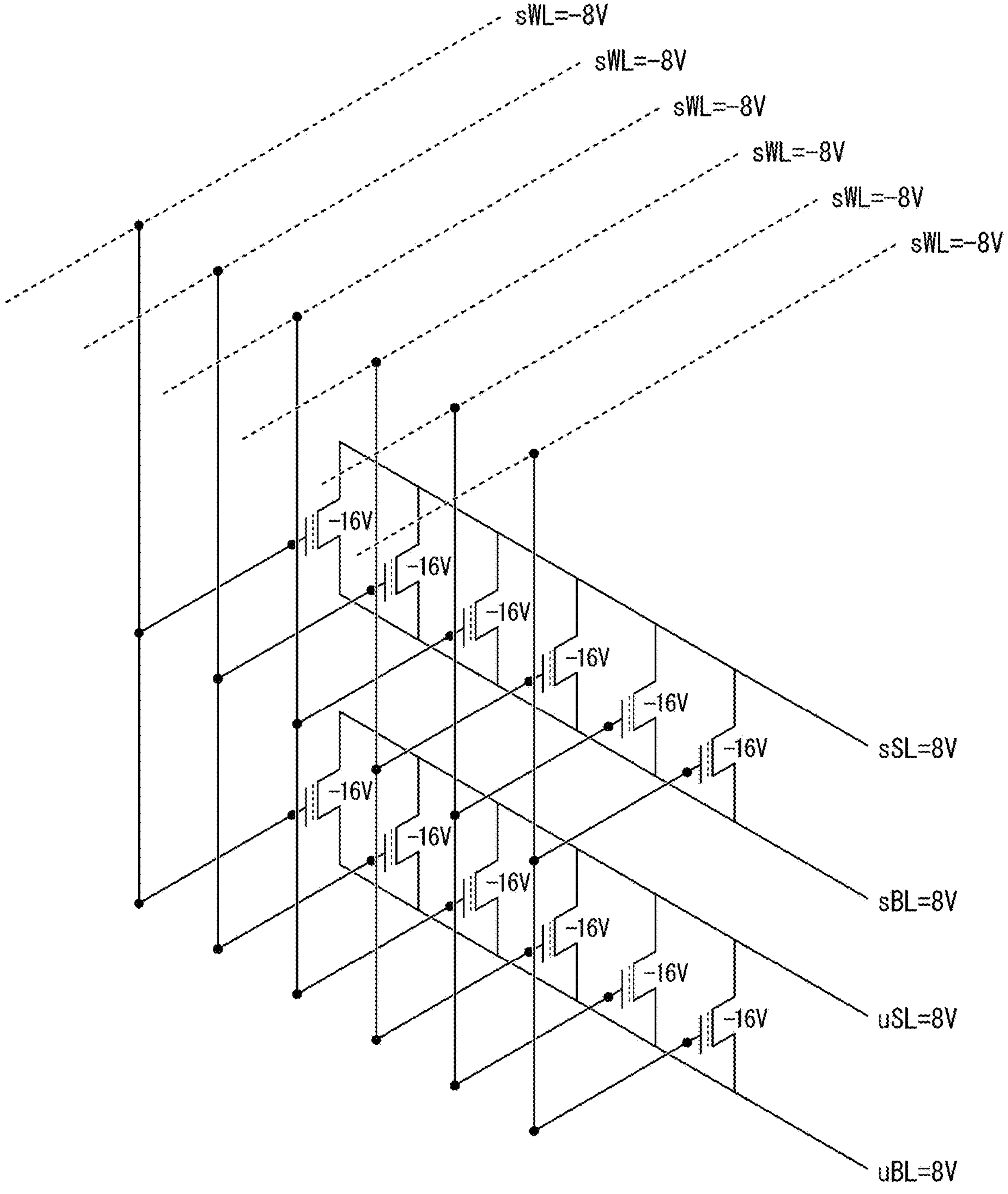
FIG. 5B is a diagram showing an equivalent circuit of the semiconductor storage device of the first embodiment.
Figure 6:
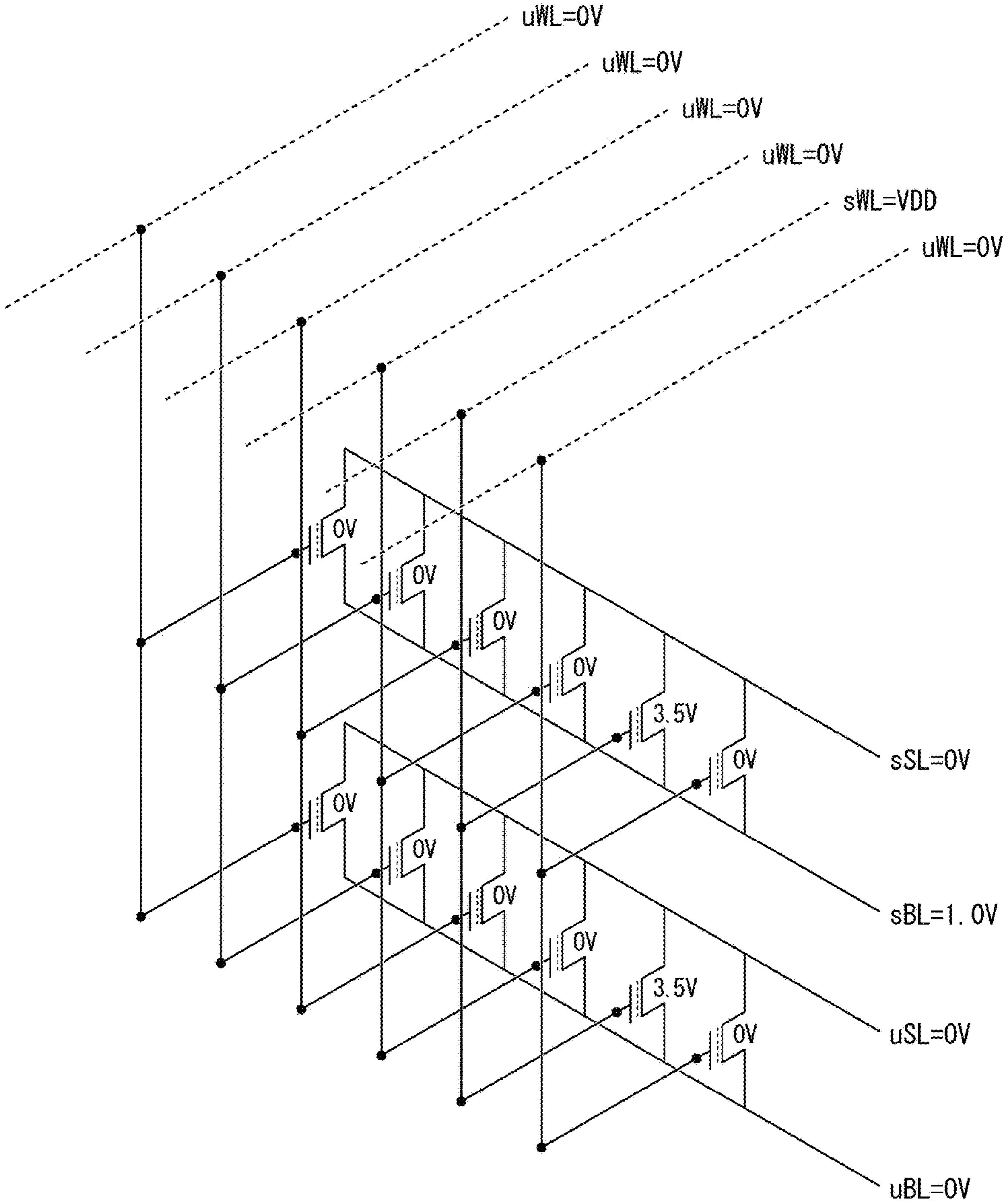
FIG. 6 is a diagram showing an equivalent circuit of the semiconductor storage device of the first embodiment.

FIGS. 4 to 6 are diagrams showing equivalent circuits of the semiconductor storage device 1A. FIG. 4 shows an example of an operating voltage at the time of writing data. FIGS. 5A and 5B show an example of an operating voltage at the time of erasing data. FIG. 6 shows an example of an operating voltage at the time of reading data. FIG. 5A shows an operating voltage at the time of erasing in units of pages (page erase). FIG. 5B shows an operating voltage at the time of erasing in units of blocks (block erase). Further, the equivalent circuits shown in FIGS. 4 to 6 describe operating voltages assumed when MANOS type memory cells are applied as the semiconductor storage device 1A.

First, at the time of writing data, as shown in FIG. 4, a predetermined voltage (−9 V in the case of FIG. 4) is applied to a selected source line sSL and a selected bit line sBL that are to be written among the source lines SL (corresponding to the source lines SL in FIG. 2) and bit lines BL (corresponding to the bit lines BL in FIG. 2). In addition, when a predetermined voltage (12 V in the case of FIG. 4) is applied to an optionally-selected word line sWL that has been selected among the word line wirings WL, a predetermined voltage (21 V in the case of FIG. 4) is applied to a memory cell to be written, and thereby data writing is performed. At this time, no voltage (that is, 0 V) may be applied to an unselected source line uSL and an unselected bit line uBL which are not to be written, but in consideration of program disturb, a non-selective voltage of approximately 2 V may be applied as shown in FIG. 4. Further, in the embodiment, at the time of writing data, writing using the channel hot electron (CHE) may be used.

Next, an operating voltage at the time of erasing data will be described.

Regarding an operating voltage at the time of page erasing, first, a constant negative voltage (−8 V in the case of FIG. 5A) is applied to all the word lines sWL as shown in FIG. 5A. In addition, when a predetermined voltage is applied to the source line sSL and the bit line sBL (both 8 V in the case of FIG. 5A) corresponding to a page to be erased, the page can be erased. At this time, a voltage to such an extent that the target page is not erased (−3 V in the case of FIG. 5A) may be applied to the unselected source line uSL and the unselected bit line uBL which are not to be erased.

On the other hand, regarding an operating voltage at the time of block erasing, when the same voltage is applied to all the source lines sSL and bit lines sBL in the block (all 8 V in the case of FIG. 5B) as shown in FIG. 5B, the block can be erased. At this time, for other blocks (not shown in the drawings) that are not to be erased, a voltage to such an extent that the blocks are not erased (−3 V in the case of FIG. 5A) may be applied as in the unselected source line uSL and the unselected bit line uBL shown in FIG. 5A.

As described above, according to the semiconductor storage device 1A of the embodiment, both the page erasing and the block erasing are possible.

Next, an operating voltage at the time of reading data will be described.

At the time of reading data, as shown in FIG. 6, when a predetermined voltage (1.0 V in the case of FIG. 4) is applied between the selected source line sSL and the selected bit line sBL that are to be read, memory cells to be read can be read. Here, in the semiconductor storage device 1A of the embodiment, the plurality of functional layers 21 are electrically independent of each other. Therefore, even in a lower layer shown in FIG. 6, a predetermined voltage is applied instead of "0 V", and reading can be performed in parallel with an upper layer.

<3. Manufacturing Method of Semiconductor Storage Device>

Figure 7:
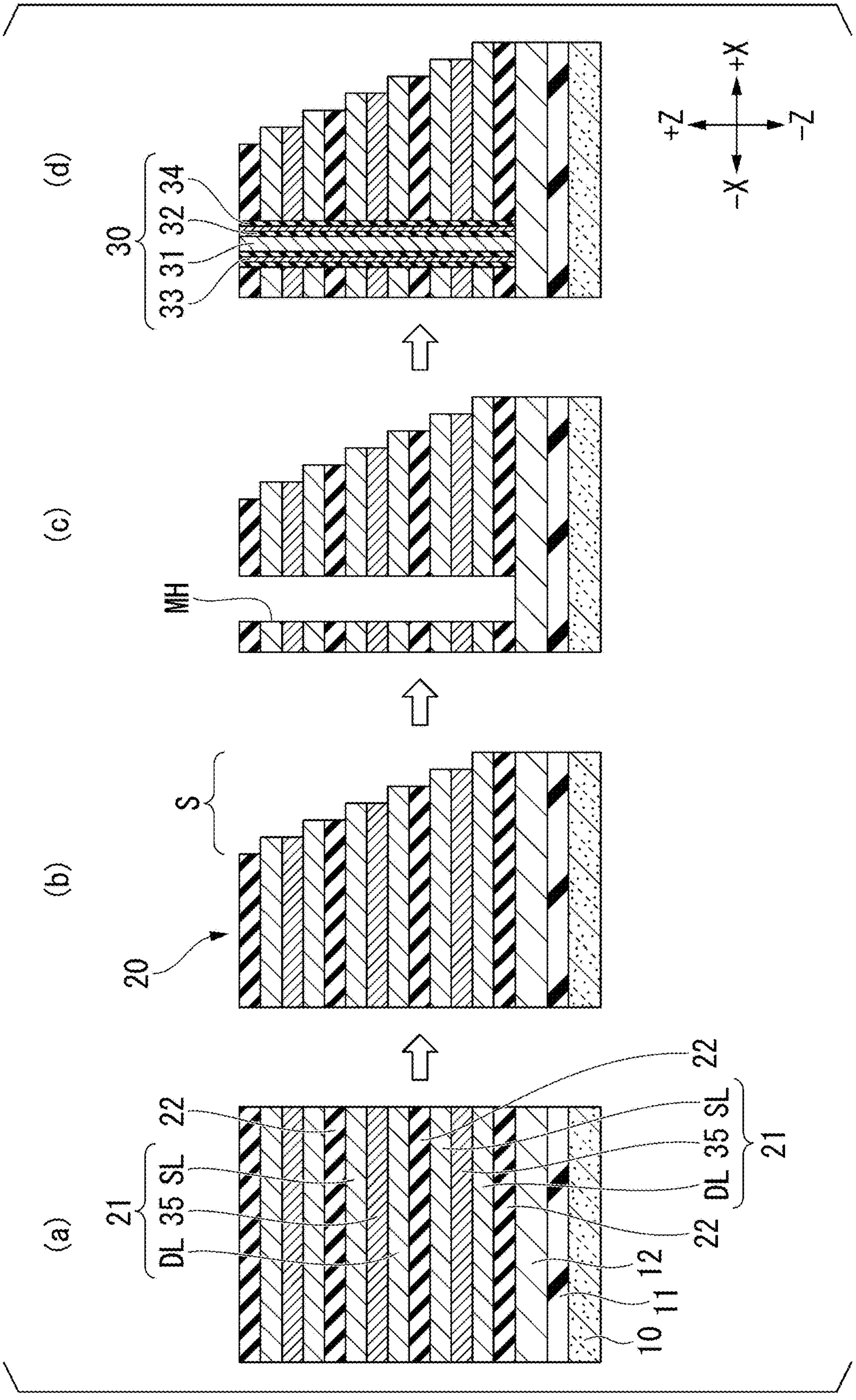
FIG. 7 is a view showing a manufacturing method of the semiconductor storage device of the first embodiment.

Next, a manufacturing method of the semiconductor storage device 1A will be described. FIG. 7 is a cross-sectional view showing a manufacturing method of the semiconductor storage device 1A. Further, materials described below are merely examples and do not limit the contents of the embodiment.

As shown in PART (a) of FIG. 7, the insulating layer 11 and the semiconductor layer 12 are formed on the silicon substrate 10. Next, on the stopper 12, the insulating layer 22 and the functional layer 21 including the source line SL, the bit line BL, and the semiconductor layer 35 are alternately stacked. Therefore, the multi-layered body 20 is formed.

Next, as shown in PART (b) of FIG. 7, the staircase region S is formed at an end part of the multi-layered body 20 in the X direction. Further, although not shown in FIG. 7, on the source line SL and bit line BL exposed by the staircase region S, the lead-out lines 91 and 92 (refer to FIG. 2) for connection to the source line wiring (not shown in the drawings) or the bit line wiring (not shown in the drawings) are provided. The staircase region S may be formed after the memory hole MH to be described later is formed.

Next, as shown in PART (c) of FIG. 7, the memory hole MH is provided by etching at a position at which the pillar 30 will be formed in a later process. The memory hole MH is a hole extending in the Z direction. In the embodiment, when the stopper layer 12 is provided, the memory hole MH is prevented from being excessively deeply etched.

Next, as shown in PART (d) of FIG. 7, a material of the tunnel insulating film 34, a material of the memory film 33, and a material of the block insulating film 32 are supplied in order on an inner surface of the memory hole MH. Therefore, the tunnel insulating film 34, the memory film 33, and the block insulating film 32 are formed. Next, polysilicon (Poly-Si) is supplied inside the block insulating film 32, and impurities are doped. Therefore, the gate wiring 31 is formed.

Although illustrations of the following processes are omitted, the contact 80 (refer to FIG. 2) connected to the gate wiring 31 and the word line wiring WL are provided, and thereby the semiconductor storage device 1A is manufactured.

Although the semiconductor storage device 1A of the embodiment has been described above, planar layouts of the elements constituting the semiconductor storage device 1A are not limited to the layouts shown in FIG. 1, and may be other layouts. For example, the number and disposition of the pillars 30 disposed in one block may be changed as appropriate.

The semiconductor storage device 1A according to the first embodiment has a cell array structure in which the gate wiring 31 is provided in the memory hole MH extending in the Z direction, and the source line SL and the bit line BL are stacked in the Z direction. Therefore, selection of the memory cell and a read operation can be performed by simply optionally selecting bit line and word line. Further, since the structure is such that the memory cell is disposed in parallel between the source line SL and the bit line BL, a read current increases. Since access is possible in units of bits, random access performance can be improved.

Second Embodiment

Next, a second embodiment will be described.

The second embodiment differs from the first embodiment in that a semiconductor layer 35*a* is not formed in a layer shape extending in an X direction and a Y direction, but is formed in an annular shape that surrounds a pillar 30 including a gate wiring 31 when viewed in a Z direction. Configurations other than those described below are the same as the configurations of the first embodiment.

Figure 8:
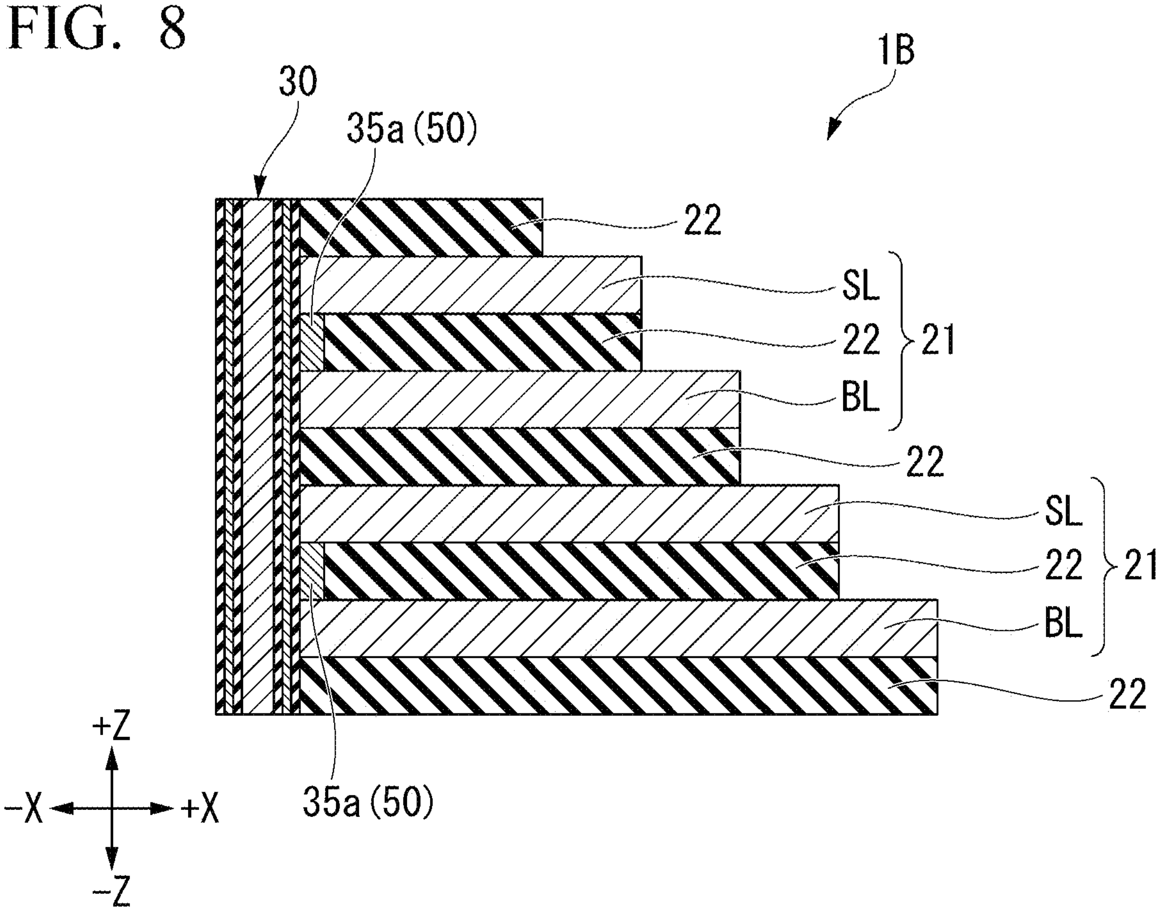
FIG. 8 is a cross-sectional view showing a semiconductor storage device of a second embodiment.

FIG. 8 is an enlarged cross-sectional view showing a main part of a semiconductor storage device 1B of the second embodiment. In the embodiment, a plurality of source lines SL and a plurality of bit lines BL are alternately stacked in the Z direction. An insulating layer 22 and the semiconductor layer 35 are provided between the source line SL and the bit line BL. In the second embodiment, a functional layer 21 is constituted by the source line SL, the bit line BL, the semiconductor layer 35*a*, and the insulating layer 22 provided between the source line SL and the bit line BL. The semiconductor layer 35*a* includes a memory film 33 and a channel portion 50 in the X direction as in the first embodiment.

In the embodiment, the insulating layer 22 provided between the functional layers 21 adjacent to each other in the Z direction functions as an interlayer insulating layer for electrically insulating the functional layers 21 from each other.

Figure 9:
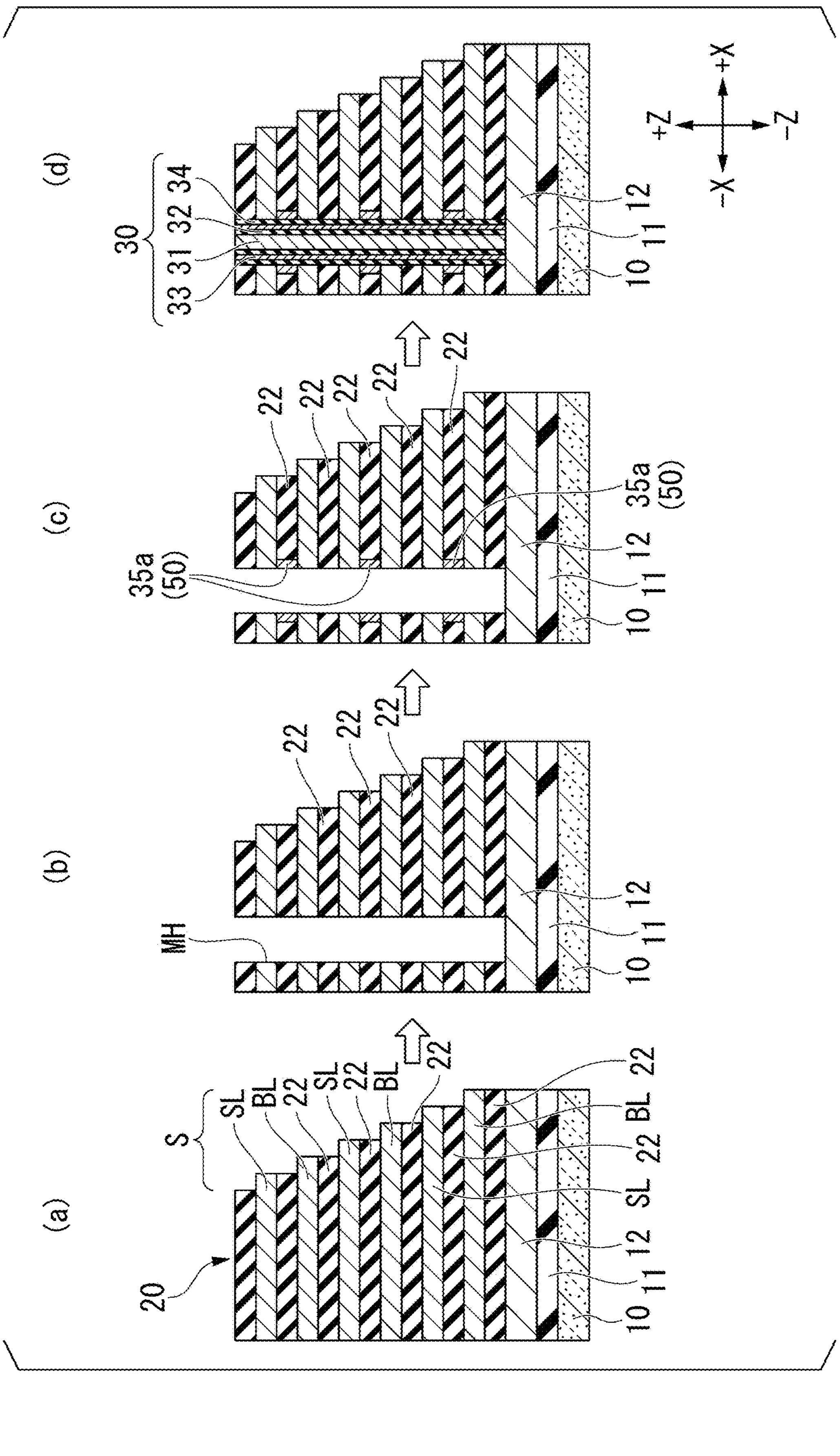
FIG. 9 is a view showing a manufacturing method of the semiconductor storage device of the second embodiment.

FIG. 9 is a cross-sectional view showing a manufacturing method of the semiconductor storage device 1B of the second embodiment. As shown in PART (a) of FIG. 9, an insulating layer 11 and a stopper layer 12 are formed on a silicon substrate 10 as in the first embodiment. Next, the insulating layer 22, the source line SL, the insulating layer 22, and the bit line BL are repeatedly stacked in that order on the stopper layer 12. Next, similarly to the first embodiment, a staircase region S is formed at an end part of a multi-layered body 20 in the X direction.

Next, as shown in PART (b) of FIG. 9, a memory hole MH is provided by etching at a position at which the pillar 30 will be formed in a later process similarly to the first embodiment. The memory hole MH is a hole extending in the Z direction. Also in the embodiment, when the stopper layer 12 is provided, the memory hole MH is prevented from being excessively deeply etched.

Next, as shown in PART (c) of FIG. 9, a part of the insulating layer 22 exposed in the memory hole MH is removed by etch back, and the semiconductor layer 35 (the channel portion 50) is formed in a recess between the insulating layers 22 formed by the removal.

Next, as shown in PART (d) of FIG. 9, a material of a tunnel insulating film 34, a material of the memory film 33, and a material of the block insulating film 32 are supplied in order on an inner surface of the memory hole MH. Therefore, the tunnel insulating film 34, the memory film 33, and the block insulating film 32 are formed. Next, polysilicon (Poly-Si) is supplied inside the block insulating film 32, and impurities are doped. Therefore, the gate wiring 31 is formed.

Even with such a configuration, as in the first embodiment, it is possible to provide the semiconductor storage device 1B capable of performing optional selection of a memory cell and read/write operations by simply optionally selecting a word line. Also, in the second embodiment, compared to the first embodiment, since the semiconductor layer 35 is formed only in a region to be the channel portion 50, unnecessary leakage current between the source line SL and the bit line BL in an array operation is expected to be suppressed.

Third Embodiment

Next, a third embodiment will be described.

The third embodiment differs from the first embodiment in that a semiconductor layer 35*b* is not formed in a layer shape extending in an X direction and a Y direction, but is formed in a cylindrical shape to surround a tunnel insulating film 34. That is, the semiconductor layer 35*b* of the third embodiment is provided in a cylindrical shape extending in a Z direction to cover an outer circumference of a pillar 30. Configurations other than those described below are the same as the configurations of the first embodiment.

Figure 10:
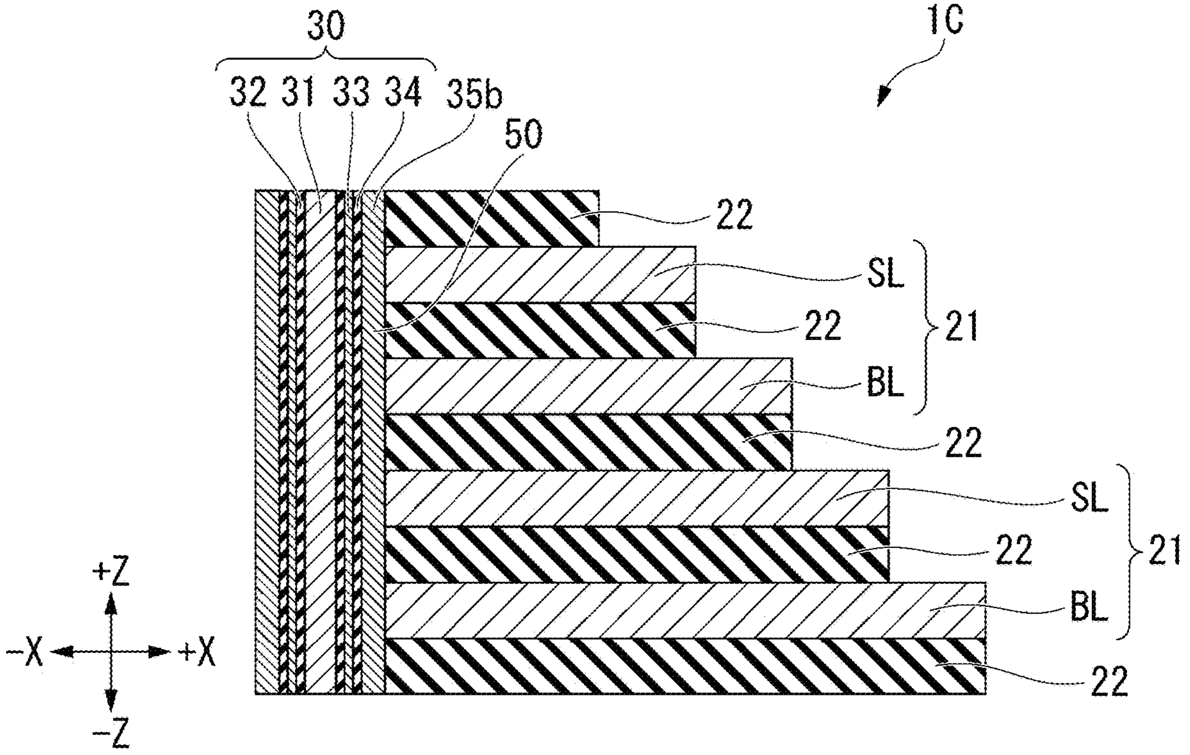
FIG. 10 is a cross-sectional view showing a semiconductor storage device of a third embodiment.

FIG. 10 is an enlarged cross-sectional view showing a main part of a semiconductor storage device 1C of the third embodiment. In the embodiment, as in the first embodiment, a plurality of source lines SL and a plurality of bit lines BL are alternately stacked in the Z direction. An insulating layer 22 is provided between the source line SL and the bit line BL.

The semiconductor layer 35 is provided to cover the outer circumference of the pillar 30 (that is, to surround an outer circumference of the tunnel insulating film 34 on a side opposite to a gate wiring 31). In other words, the semiconductor layer 35 is provided between a memory film 33 and the insulating layer 22, between the memory film 33 and the source line SL, and between the memory film 33 and the bit line BL. In the embodiment, the semiconductor layer 35 extends in the Z direction across most of the pillar 30. That is, the semiconductor layer 35 extends in the Z direction along the gate wiring 31.

In the embodiment, the semiconductor layer 35 includes a channel portion 50. The channel portion 50 is a region of the semiconductor layer 35 positioned at the same height as the source line SL and the drain line DL. In other words, the channel portion 50 is a region of the semiconductor layer 35 aligned with the functional layer 21 in the X direction. The channel portion 50 includes a semiconductor and is in contact with the source line SL and the bit line BL.

In the embodiment, the insulating layer 22 provided between the functional layers 21 adjacent to each other in the Z direction functions as an interlayer insulating layer for electrically insulating the functional layers 21 from each other.

Even with such a configuration, as in the first embodiment, it is possible to provide the semiconductor storage device 1B capable of performing optional selection of a memory cell and read/write operations by simply optionally selecting a word line.

Fourth Embodiment

Next, a fourth embodiment will be described.

The fourth embodiment differs from the first embodiment in that a semiconductor layer 35 is not formed in a layer shape extending in an X direction and a Y direction, but is formed in an annular shape that surrounds a pillar 30 including a gate wiring 31 when viewed in a Z direction, and in that the insulating layer 22 electrically insulating the functional layers 21 from each other to function as an interlayer insulating film is not included. Configurations other than those described below are the same as the configurations of the first embodiment.

Figure 11:
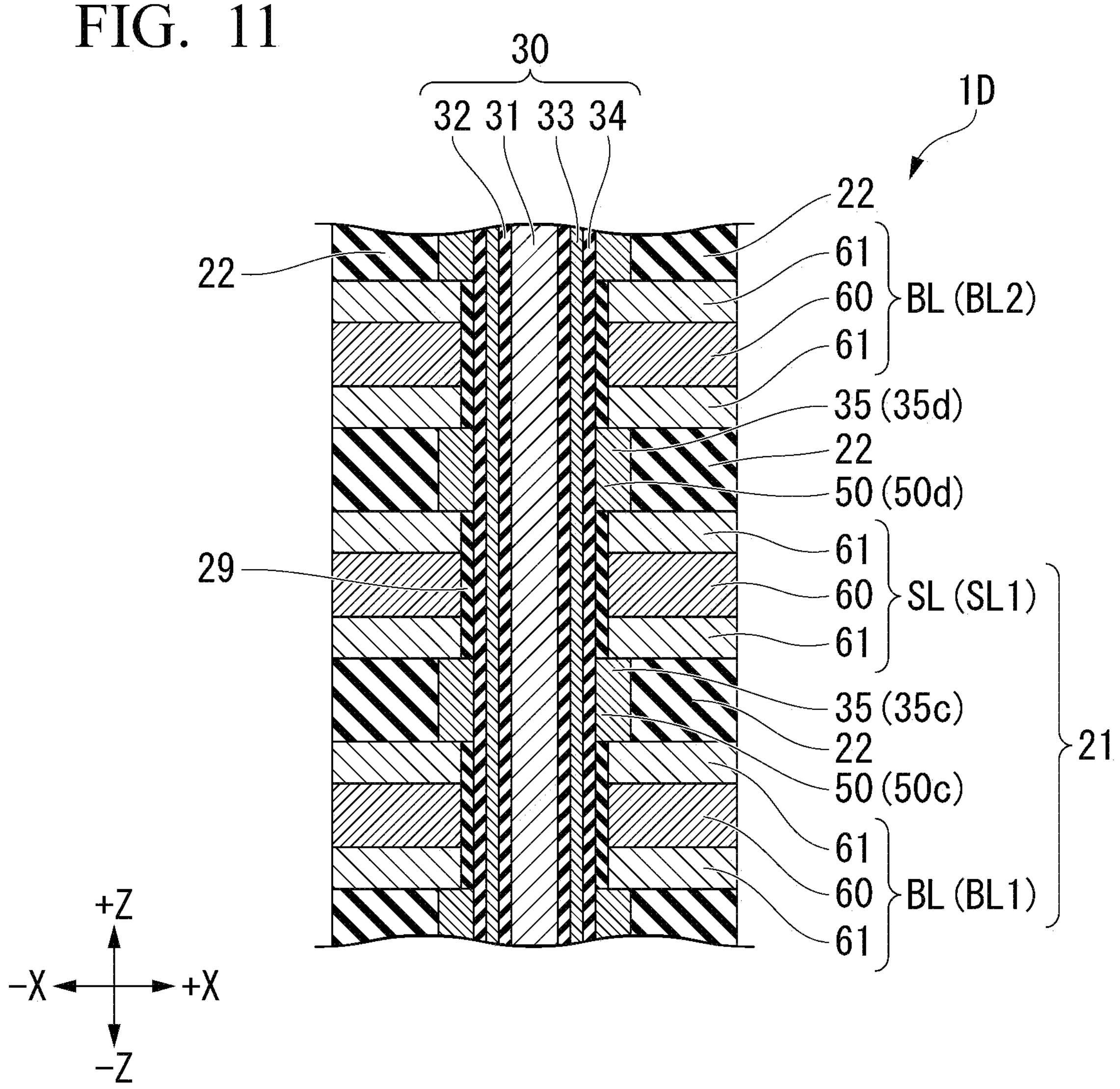
FIG. 11 is a cross-sectional view showing a semiconductor storage device of a fourth embodiment.

FIG. 11 is an enlarged cross-sectional view showing a main part of a semiconductor storage device 1D of the fourth embodiment. In the embodiment, as in the first embodiment, a plurality of source lines SL and a plurality of bit lines BL are alternately stacked in the Z direction. FIG. 11 shows a state in which two bit lines BL1 and BL2 are stacked via one source line SL1. The source line SL1 is an example of a "first conductive layer". The bit line BL1 is an example of a "second conductive layer", and the bit line BL2 is an example of a "third conductive layer". Both the source line SL and the bit line BL may each have a single layer structure (refer to FIG. 2) using the material described in the first embodiment. Both the source line SL and the bit line BL may each have a multi-layer structure in which, for example, a metal layer 60 such as tungsten (W) and a polysilicon (Poly-Si) layer 61 doped with impurities are stacked as shown in FIG. 11.

An insulating layer 22 and the semiconductor layer 35 (35*c*, 35*d*) are provided between the source line SL and the bit line BL. In the embodiment, a functional layer 21 is constituted by the source line SL, the bit line BL, the semiconductor layer 35 (35*c*, 35*d*), and the insulating layer 22. The insulating layer 22 is provided between the source line SL and the bit line BL. The semiconductor layer 35 (35*c*, 35*d*) is aligned with a memory film 33 in the X direction as in the first embodiment, and includes a channel portion 50 (50*c*, 50*d*). Further, the semiconductor layer 35*c* is an example of a "first semiconductor layer", and the semiconductor layer 35*d* is an example of a "third semiconductor layer".

Similarly to the second embodiment, the semiconductor layer 35 of the embodiment is provided to cover an outer circumference of the pillar 30, that is, to surround an outer circumference of a tunnel insulating film 34 on a side opposite to the gate wiring 31. The semiconductor layer 35 extends in the Z direction along the gate wiring 31.

Also, in the embodiment, an insulating layer 29 is provided between the semiconductor layers 35 adjacent to each other in the Z direction. The insulating layer 29 is provided to cover an outer circumference of the pillar 30 between the pillar 30, and the source line SL and bit line BL. Similarly to the semiconductor 35, the insulating layer 29 extends in the Z direction along the gate wiring 31. A thickness of the insulating layer 29 in the X direction is designed to be smaller than the thickness of the semiconductor layer 35.

Also, the semiconductor storage device 1D of the embodiment also includes a plurality of gate wirings 31 similarly to the first embodiment. The plurality of gate wirings 31 are provided, for example, in a lattice shape when viewed from the Z direction (not shown in the drawings). In this way, also in the semiconductor storage device 1D of the fourth embodiment, memory cells provided in the gate wirings 31 adjacent in the X direction or the Y direction can be integrated in the X direction or the Y direction.

Further, in the fourth embodiment, in one gate wiring 31, the semiconductor layers 35 (35*c*, 35*d*) are provided intermittently in the Z direction. Such a form is also the same in other gate wirings (for example, "second conductive pillars") adjacent in the X direction. That is, even in other gate wirings (for example, the "second conductive pillars") adjacent in the X direction, the semiconductor layer 35 (not shown in the drawings, a "second semiconductor layer") is provided intermittently in the Z direction. In this case, the memory film 33*b* is provided between the gate wiring ("second conductive pillar") and the semiconductor layer ("second semiconductor layer").

In the embodiment, the insulating layer 22 is provided between the source line SL and the bit line BL. The insulating layer 29 is provided between the semiconductor layers 35 adjacent to each other in the Z direction. The functional layers 21 can be electrically separated from each other by the insulating layer 22 and the insulating layer 29. Therefore, a so-called interlayer insulating film provided between the functional layers 21 that overlaps each other in the Z direction can be omitted.

Figure 12A:
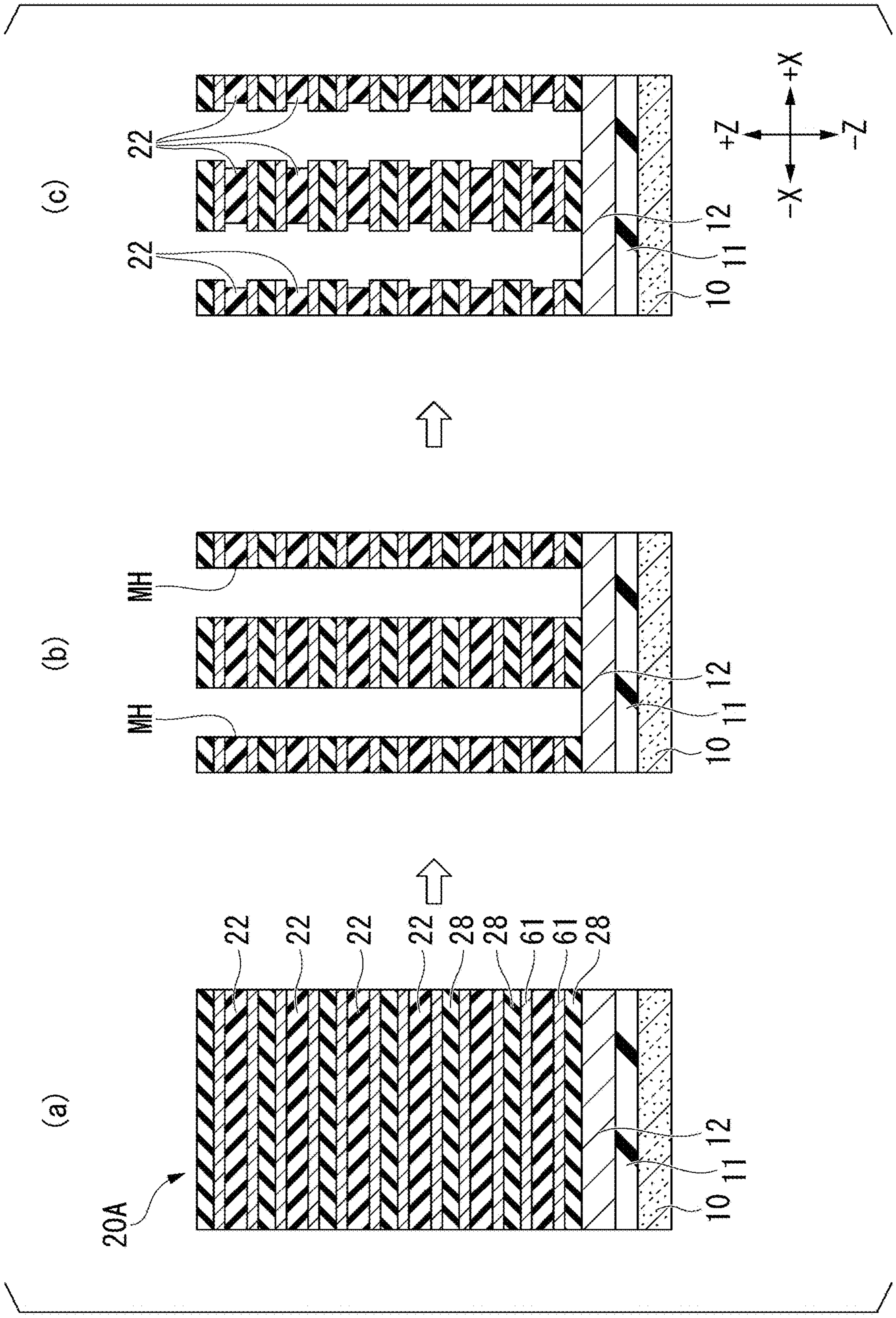
FIG. 12A is a view showing a manufacturing method of the semiconductor storage device of the fourth embodiment.
Figure 12B:
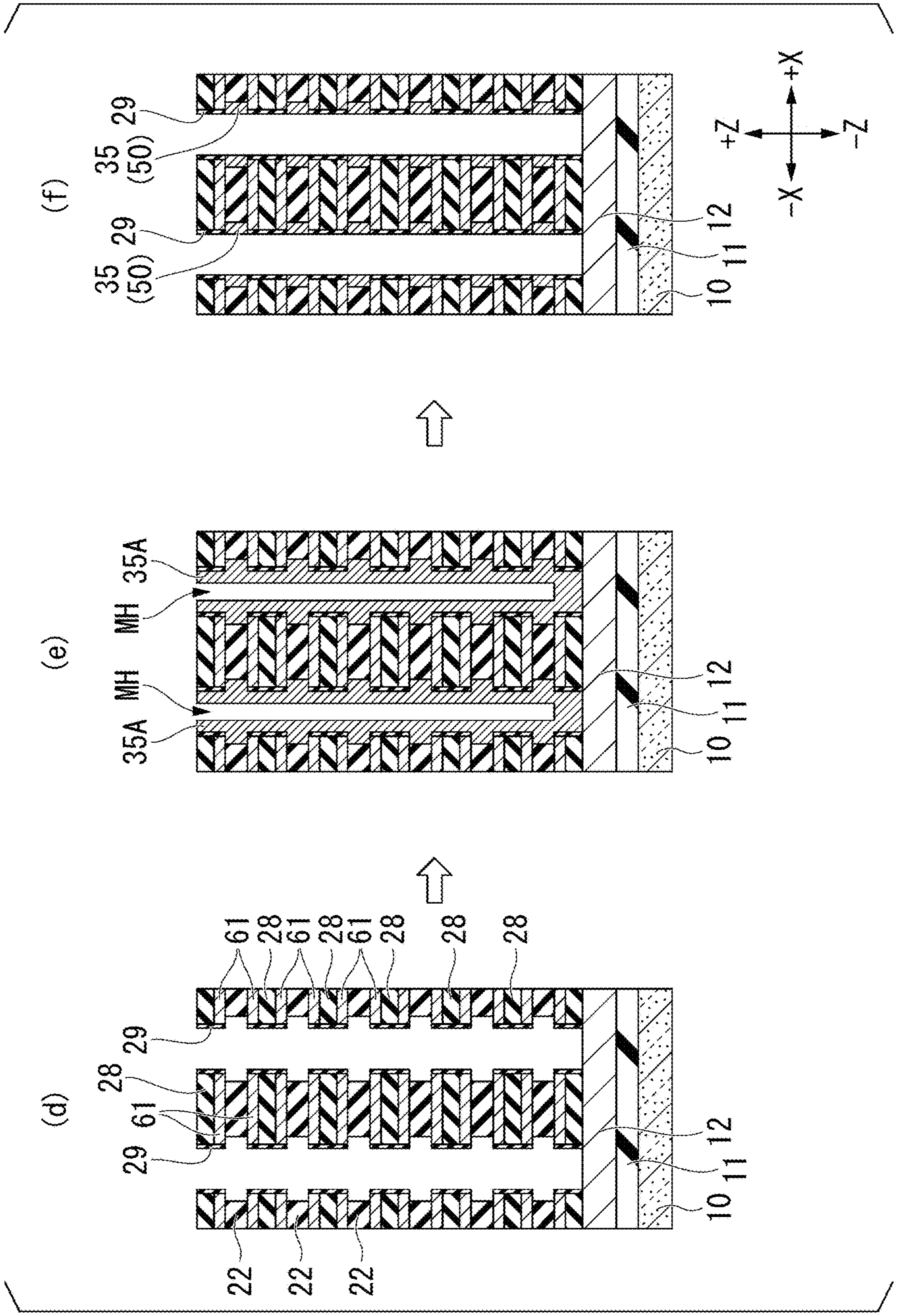
FIG. 12B is a view showing the manufacturing method of the semiconductor storage device of the fourth embodiment.
Figure 12C:
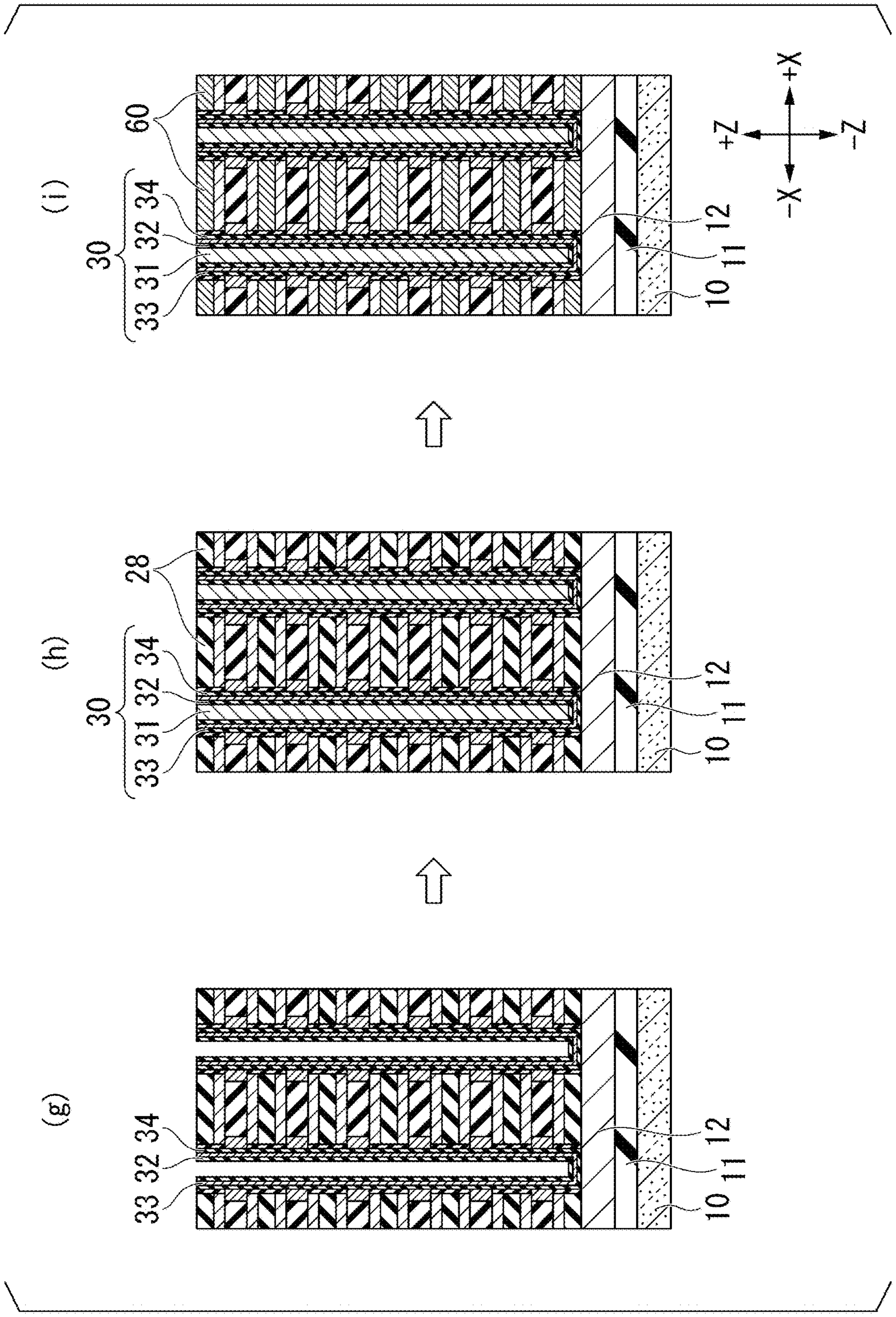
FIG. 12C is a view showing the manufacturing method of the semiconductor storage device of the fourth embodiment.

FIGS. 12A, 12B, and 12C are cross-sectional views showing a manufacturing method of the semiconductor storage device 1D of the fourth embodiment. As shown in PART (a) of FIG. 12, first, an insulating layer 11 and a stopper layer 12 are formed on a silicon substrate 10. Next, a sacrificial film 28, the polysilicon layer 61, the insulating layer 22, and the polysilicon layer 61 are repeatedly stacked in that order on the stopper layer 12 to form a multi-layered body 20A. Further, although not shown in FIG. 12A, a staircase region S is formed at an end part of the multi-layered body 20A in the X direction as in the first embodiment.

Next, as shown in PART (b) of FIG. 12A, similarly to the first embodiment, a memory hole MH is provided by etching at a position at which the pillar 30 will be formed in a later process. The memory hole MH is a hole extending in the Z direction. Also, in the embodiment, when the stopper 12 is provided, the memory hole MH is prevented from being excessively deeply etched.

Next, as shown in PART (c) of FIG. 12A, a part of the insulating layer 22 exposed in the memory hole MH is removed by etch back.

Next, as shown in PART (d) of FIG. 12B, the insulating layer 29 is formed on side surfaces of the sacrificial film 28 and the polysilicon layer 61 exposed in the memory hole MH. The insulating layer 29 may be formed by oxidizing the side surfaces of the sacrificial film 28 and the polysilicon layer 61 exposed in the memory hole MH.

Next, as shown in PART (e) of FIG. 12B, a material 35A of the semiconductor layer 35 is supplied to an inner surface of the memory hole MH (that is, the side surface of the insulating layer 29 and the side surface of the insulating layer 22).

Next, as shown in PART (f) of FIG. 12B, an unnecessary portion of the supplied material 35A of the semiconductor layer 35 is removed by etch back. Specifically, the material 35A is removed until the insulating layer 29 is exposed. Therefore, the semiconductor layer 35 (the channel portion 50) is formed in a recess (refer to PART (c) of FIG. 12A) formed by removing a part of the insulating layer 22.

Next, as shown in PART (g) of FIG. 12C, a material of the tunnel insulating film 34, a material of the memory film 33, and a material of the block insulating film 32 are supplied to the inner surface of the memory hole MH in this order. Therefore, the tunnel insulating film 34, the memory film 33, and the block insulating film 32 are formed. However, similarly to the first embodiment, a cell structure of the fourth embodiment is not limited to a MANOS type. That is, the cell structure of the fourth embodiment may also be a structure other than the MANOS type, and in that case, the cell structure may be, for example, a ferroelectric gate field effect transistor (FeFET) having a ferroelectric film as the memory film 33. A ferroelectric film stores a data value according to, for example, an orientation of polarization. The ferroelectric film is formed of, for example, hafnium oxide (HfO), zirconia (ZrO), hafnium-zirconia oxide (HfZrO), or the like.

Next, as shown in PART (h) of FIG. 12C, polysilicon (Poly-Si) is supplied inside the block insulating film 32 and impurities are doped. Therefore, the gate wiring 31 is formed. Further, tungsten (W) may also be used as a material for the gate wiring 31.

Next, as shown in PART (i) of FIG. 12C, the sacrificial film 28 is replaced with the metal layer 60 by a replacement processing (replace process). Specifically, in this replacement processing, after the sacrificial film 28 is removed, the metal layer 60 containing tungsten (W) or the like is embedded in a space (cavity) from which the sacrificial film 28 has been removed.

Through the processes described above, the semiconductor storage device 1D (refer to FIG. 11) of the fourth embodiment is manufactured.

Even with such a configuration, as in the first embodiment, it is possible to provide the semiconductor storage device capable of performing optional selection of a memory cell and read/write operations by simply optionally selecting a word line. Also, since the fourth embodiment does not include the insulating layer 22 that functions as an interlayer insulating film in the first embodiment, it is possible to provide a highly integrated semiconductor storage device.

According to at least one embodiment described above, a semiconductor storage device includes a first conductive layer extending in a first direction, a second conductive layer along the first conductive layer in a third direction intersecting the first direction and extending in the first direction, a first conductive pillar penetrating the first conductive layer and the second conductive layer in the third direction, a first semiconductor layer in contact with the first conductive layer and the second conductive layer and facing the first conductive pillar in the first direction, and a first storage layer between the first semiconductor layer and the first conductive pillar. According to such a configuration, it is possible to provide a semiconductor storage device capable of performing optional selection of a memory cell and read/write operations.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a first conductive layer extending in a first direction;

a second conductive layer along the first conductive layer in a third direction intersecting the first direction, the second conductive layer extending in the first direction;

a first conductive pillar penetrating the first conductive layer and the second conductive layer in the third direction;

a first semiconductor layer in contact with the first conductive layer and the second conductive layer, the first semiconductor layer facing the first conductive pillar in the first direction; and a first storage layer between the first semiconductor layer and the first conductive pillar.

2. The semiconductor storage device according to claim 1, wherein the first storage layer has a cylindrical shape surrounding the first conductive pillar.

3. The semiconductor storage device according to claim 1, wherein the first semiconductor layer has a cylindrical shape surrounding the first conductive pillar.

4. The semiconductor storage device according to claim 1, further comprising:

a second conductive pillar penetrating the first conductive layer and the second conductive layer in the third direction;

a second semiconductor layer in contact with the first conductive layer and the second conductive layer, the second semiconductor layer facing the second conductive pillar in the first direction; and a second storage layer between the second semiconductor layer and the second conductive pillar.

5. The semiconductor storage device according to claim 1, further comprising:

a third conductive layer along the second conductive layer via the first conductive layer in the third direction, the third conductive layer extending in the first direction; and a third semiconductor layer in contact with the first conductive layer and the third conductive layer, the third semiconductor layer facing the first conductive pillar, wherein the first storage layer is between the third semiconductor layer and the first conductive pillar.

* * * * *